(12) United States Patent
Bailey III

(10) Patent No.: US 6,922,603 B1
(45) Date of Patent: Jul. 26, 2005

(54) SYSTEM AND METHOD FOR QUANTIFYING UNIFORMITY PATTERNS FOR TOOL DEVELOPMENT AND MONITORING

(75) Inventor: Andrew D. Bailey III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 198 days.

(21) Appl. No.: 10/327,233

(22) Filed: Dec. 20, 2002

Related U.S. Application Data

(60) Provisional application No. 60/414,021, filed on Sep. 26, 2002.

(51) Int. Cl.$^7$ .............................................. G06F 19/00
(52) U.S. Cl. ......................... 700/121; 700/98; 700/182
(58) Field of Search ............................... 700/121, 109, 700/110, 117; 438/7–9, 16; 702/81, 84, 182–183

(56) References Cited

U.S. PATENT DOCUMENTS

| | | | | |
|---|---|---|---|---|
| 5,640,237 A | * | 6/1997 | Esrig et al. ............... | 356/237.2 |
| 5,751,582 A | * | 5/1998 | Saxena et al. .............. | 700/109 |
| 6,392,745 B1 | * | 5/2002 | Mavliev et al. .............. | 356/37 |
| 6,665,623 B1 | * | 12/2003 | Pasadyn et al. .............. | 702/84 |
| 6,706,541 B1 | * | 3/2004 | Toprac et al. .................. | 438/7 |

OTHER PUBLICATIONS

N.R. Draper, H. Smith, "Applied Regression Analysis", pp. 530–535, Second Edition, John Wiley & Sons.

Michael Nikolaou, Andrew D. Bailey, III, "Application of Reduced–Rank Multivariate Methods To The Monitoring Of Spatial Uniformity Of Wafer Etching", pp. 1–6.

* cited by examiner

*Primary Examiner*—Kidest Bahta
(74) *Attorney, Agent, or Firm*—Martine Penilla & Gencarella, LLP

(57) ABSTRACT

A system and method of determining multiple uniformity metrics of a semiconductor wafer includes quantitatively defining a location metric of a nonuniformity on the surface of the wafer. A quantity is measured at multiple locations on a top surface of the wafer and a center of mass is of the nonuniformity is determined.

20 Claims, 12 Drawing Sheets

SYSTEM AND METHOD FOR QUANTIFYING UNIFORMITY PATTERNS FOR TOOL DEVELOPMENT AND MONITORING

CROSS REFERENCE TO RELATED APPLICATIONS

This application claims priority from U.S. Provisional Patent Application No. 60/414,021 filed on Sep. 26, 2002 and entitled "Method for Quantifying Uniformity Patterns and Including Expert Knowledge for Tool Development and Control," which is incorporated herein by reference in its entirety.

BACKGROUND OF THE INVENTION

1. Field of the Invention

The present invention relates generally to methods and systems of quantifying uniformity of measure quantities on semiconductor wafers, and more particularly, to improved methods and systems for quantifying nonuniformity patterns on semiconductor wafers before during and after process operations.

2. Description of the Related Art

Semiconductor wafers undergo numerous processes during the semiconductor manufacturing process. Layers may be added, patterned, etched, removed, polished and many other processes. After each process the wafer is typically examined to confirm the previous process was completed with an acceptable level of errors or nonuniformities. The various operating variables (e.g., event timing, gas pressure, concentrations, temperatures, etc.) of each process the wafer is processed through are recorded so that any changes in any variable may be quickly identified and potentially correlated to any errors or nonuniformities discovered when the wafer is examined FIG. 1A shows a typical etched wafer 100. A top layer of material was mostly removed from the wafer in the etch process except for a portion 106 of the top layer. For clarity purposes, the portion 106 is a portion of a layer or ultrathin film. A notch 104 is typically included in each wafer 100 so that the wafer can be oriented (aligned) in the same position during the various manufacturing processes. The portion 106 is a nonuniform portion of the surface of the wafer 100 and therefore can be termed a nonuniformity. As shown, the portion 106 is in the approximate form of a ring or annular shape where the top layer was removed from the center and around the edges of the wafer 100.

FIG. 1B shows another typical etched wafer 120. A portion 108 of a top layer remains, when the top layer was mostly removed in the etch process. The portion 108 is typically termed an azimuthal-type nonuniformity on the surface of wafer 120 because the nonuniformity 108 is not the same at the same radius around the wafer 120.

Prior art approaches to describing nonuniformities 106, 108 include subjective, verbal descriptions such as "center-fast" for annular nonuniformity 106 or "left side slow" for azimuthal nonuniformity 108. Center-fast generally describes wafer 100 because material from the center of the wafer 100 is removed faster than the material in the annular region 106. However, center-fast does not provide a specific, objective and quantitative description of the nonuniformity 106. Similarly, left side slow describes wafer 120 because the etch process removed material from the left side region 108 slower than the other regions of the wafer 120 but left side slow also fails to provide a specific, objective and quantitative description of the nonuniformity 108.

The descriptions of the nonuniformities 106, 108 are used to provide feedback to correct errors and inconsistencies in the etch and other preceding processes that were performed on the wafers 100, 120. The descriptions of the nonuniformities 106, 108 can also be used to track the impact of the nonuniformities 106, 108 on subsequent semiconductor manufacturing process and on metrics from completed semiconductor devices (e.g., device yields, performance parameters, etc.)

As nonuniformities become smaller and smaller, the nonuniformities become less symmetrical and also more difficult to accurately describe with the subjective, verbal descriptions. FIG. 1C shows a typical wafer 150 with multiple, asymmetrical nonuniformities 152A–G. The nonuniformities 152A–G can be smaller and are less symmetrical than nonuniformities 106, 108 because the various variables in the etch and other previous processes are very stringently controlled. The subjective, verbal descriptions have therefore become insufficient to accurately describe the nonuniformities 152A–G so that further improvements in the preceding processes can be successfully completed.

A more objective description of wafer uniformity is referred to as a 3-sigma uniformity metric. The 3-sigma uniformity metric quantifies a standard deviation of measurements of some quantity of the wafer. By way of example, the 3-sigma can be an expression of the deviations in thickness of the wafer detected by an array of measurement points across the wafer. FIG. 1D shows a typical 49-point array used in completing a measurement scan of wafer 160. The thickness of the wafer 160 is measured at each of the 49 points. The 49-points are arranged with a center point 162, and three concentric rings 164, 168, 172. The inner ring 164 has 8 evenly spaced points. The intermediate ring 168 has 16 evenly spaced points. The outer ring 172 has 24 evenly spaced points. The rings 164, 168, 172 are typically approximately equally spaced radially from the center point 162. Each of the points in the rings 164, 168, 172 and the center point 162 is typically assigned to represent a given portion of the wafer 160. For example, a typical wafer 160 has a 3 mm exclusion zone on the outer perimeter of the wafer 160. The rings 164, 168, 172 and the center point 162 are spaced equidistant and therefore each of the 49 points represent about $1/49^{th}$ of the area of the wafer 160, less the 3 mm exclusion zone (i.e., the outer edge of the wafer where expected process abnormalities occur). Because nonuniformities do not suddenly appear under a single scan point, the nonuniformities are smoothed due to the choice of measuring points.

The 3-sigma uniformity metric is conventionally defined to be equal to 3 times the standard deviation of the measurements on the wafer 160. The standard deviation of the thickness of the wafer 160 is determined by a sum of the thickness of the wafer 160 at each of the 49 scanned points divided by 49 times the mean thickness of the wafer. A typical 3-sigma metric of a wafer is reported as a percentage of uniformity (0% being ideal). The 3-sigma metric is also often referred to as the WIWNU metric (within wafer nonuniformity).

A 3-sigma metric provides a single, objective, quantitative, summary description of the magnitude of the nonuniformities 152A–G. Additional metrics include skewness and kurtosis, which can be derived from the measured array data. However, these metrics do not provide sufficient information to specifically identify the location and shape of the nonuniformities on the wafer 160.

In view of the foregoing, there is a need for an improved system and method of objectively quantifying nonuniformities on a semiconductor wafer that also provides location and shape of the nonuniformities.

SUMMARY OF THE INVENTION

Broadly speaking, the present invention fills these needs by providing an improved system and method of objectively quantifying nonuniformities on a semiconductor wafer that also provides location and shape of the nonuniformities. It should be appreciated that the present invention can be implemented in numerous ways, including as a process, an apparatus, a system, computer readable media, or a device. Several inventive embodiments of the present invention are described below.

One embodiment includes a method of determining multiple uniformity metrics of a semiconductor wafer and includes quantitatively defining a location metric of a non-uniformity on the surface of the wafer. A quantity is measured at multiple locations on a top surface of the wafer and a center of mass is of the nonuniformity is determined.

Measuring the quantity at multiple locations on the top (i.e. active) surface of the wafer can include measuring a thickness at each one of the multiple locations and converting the measured thickness at each one of the locations on the wafer to a corresponding mass density value.

An average mass density value for the wafer can also be determined. A standard deviation of the mass density of the wafer can also be determined.

Determining the center of mass of the wafer can include subtracting a selected value from each of the corresponding mass density values. The selected value can be a minimum mass density value of the wafer and a maximum mass density value of the wafer.

A side-to-side variation and direction of the nonuniformity can also be calculated.

Determining a shape metric of the nonuniformity can include determining at least one moment of inertia of the nonuniformity and determining a radius of gyration for each one of the at least one principal moments of inertia. Each of the at least one moments of inertia are determined around an axis that passes through the center of mass of the nonuniformity. The at least one principal moment of inertia can include at least three principal moments of inertia.

An ellipsoid can be defined by two of the at least one principal moments of inertia. An eccentricity of the ellipsoid can also be determined. An orientation of the ellipsoid can also be determined.

Another embodiment includes a method of determining a correlation between a process variable and a nonuniformity. The method includes characterizing multiple wafers. The wafers are characterized at least by determining at least one uniformity metric of a nonuniformity on each one of the wafers. The at least one uniformity metric can include at least one location metric of the nonuniformity on each one of the wafers. Each one of multiple process variables for each one of the wafers is recorded. A common uniformity metric in a subset of the characterized wafers that share a common process variable can also be identified. Characterizing the wafers can also include determining at least one shape metric of the nonuniformity for each one of the wafers.

Another embodiment includes a system for determining a correlation between a process variable and a nonuniformity on a semiconductor wafer. The system includes a scanning device that has the capability of measuring a quantity at multiple locations of each one of a set wafers. The system also includes a database that includes multiple process variables and the measured quantities at multiple locations for each one of the set of wafers. The database is coupled to the scanning device. The system also includes a processor coupled to the database and a logic that identifies a common uniformity metric in a subset of the scanned wafers that share a common process variable. The common uniformity metric includes a location metric of a nonuniformity on the surface of the wafer. The location metric includes a center of mass of the nonuniformity. The common uniformity metric can also include at least one shape metric of the nonuniformity.

The common uniformity metric can also include an ellipsoid that is defined by two principal moments of inertia of the nonuniformity. The common uniformity metric can also include an eccentricity of the ellipsoid. The common uniformity metric can also include an orientation of the ellipsoid.

The present invention provides multiple, objective metrics that specifically define a nonuniformity on a wafer. The multiple, objective metrics can be used to specifically characterize the nonuniformity and the wafer. The specific characterizations can then be accurately, objectively and even automatically compared to other characterized wafers. Accurate comparison of characterized wafers will allow more direct causal correlation between manufacturing process variables and an occurrence of a given nonuniformity on a wafer. A more direct causal correlation between manufacturing process variables and an occurrence of a given nonuniformity on a wafer allows more accurate refinement of the manufacturing process variables.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Figure 1A:
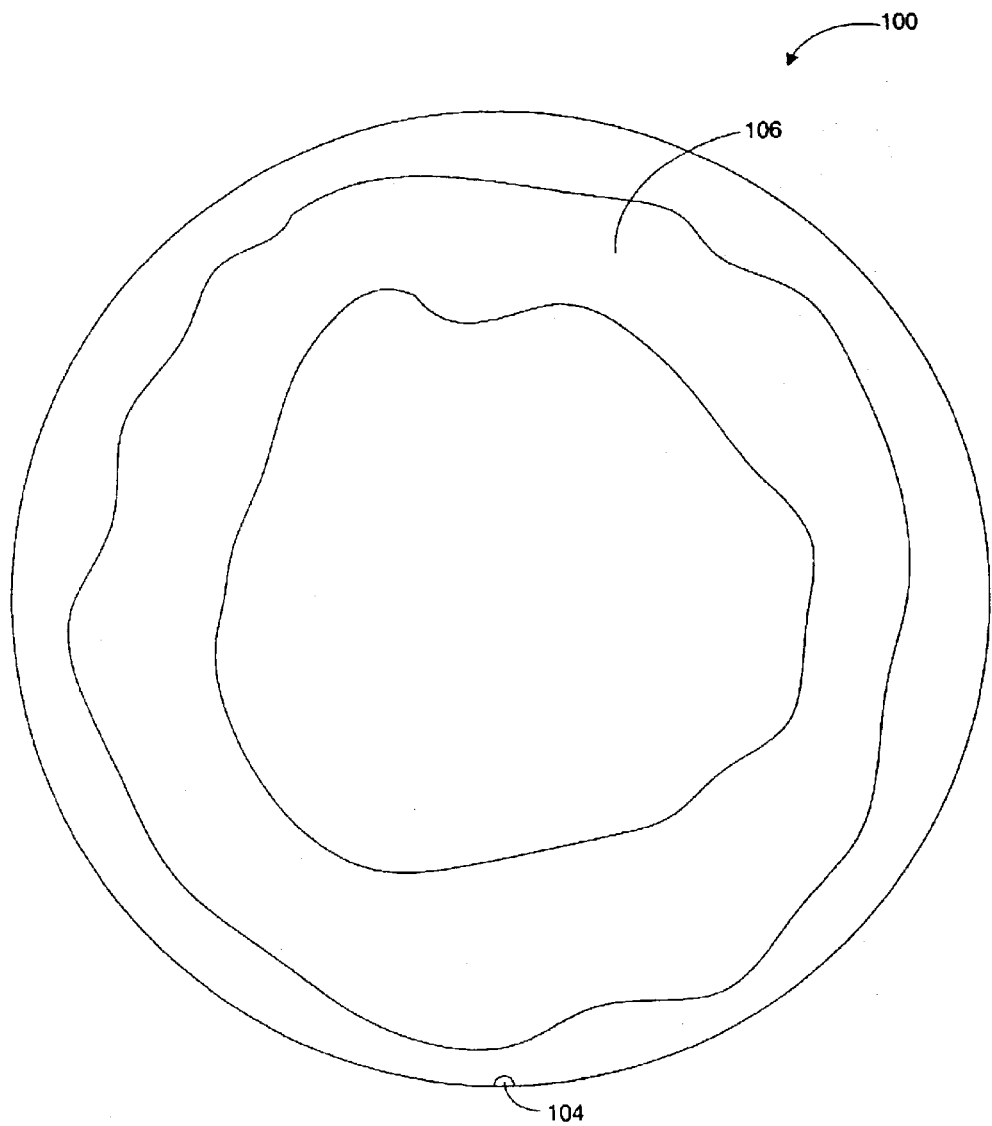
FIG. 1A shows a typical etched wafer.
Figure 1B:
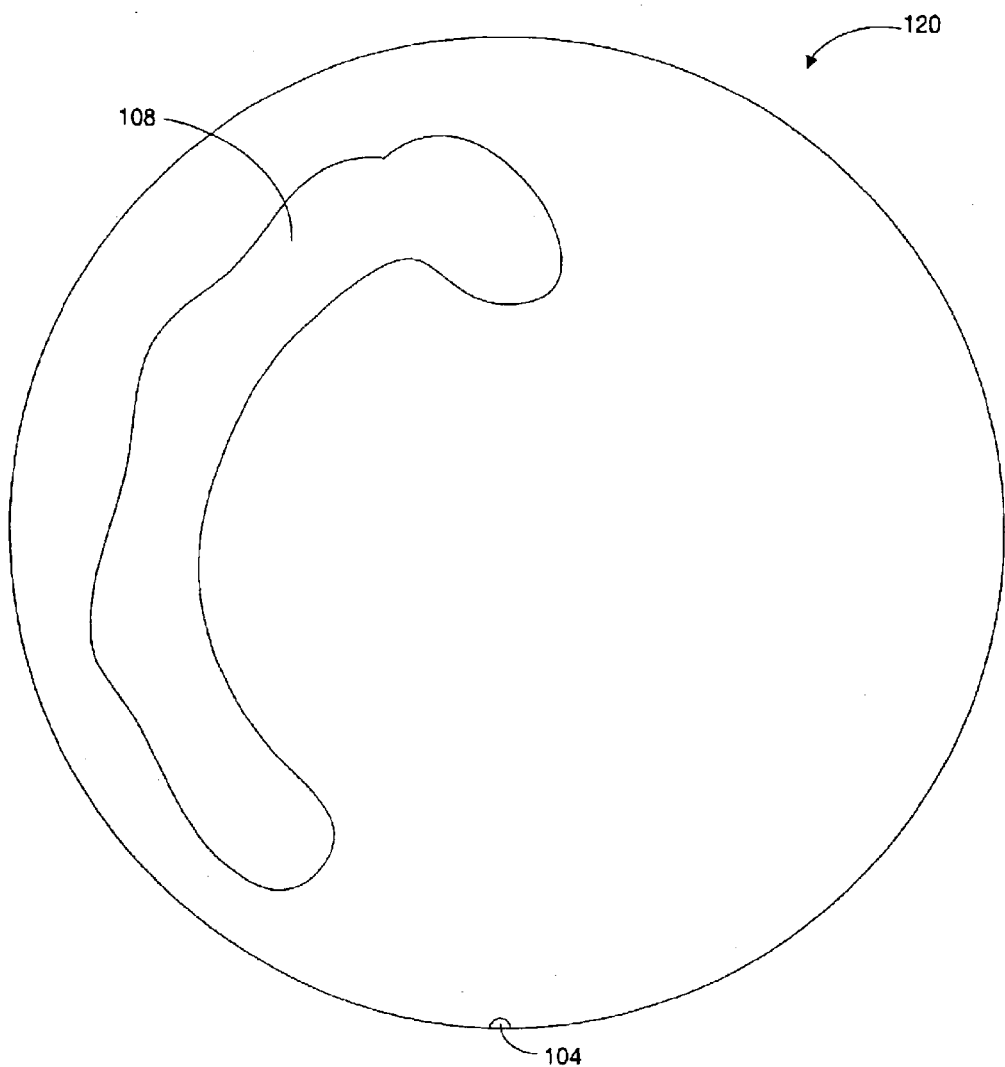
FIG. 1B shows another typical etched wafer.
Figure 1C:
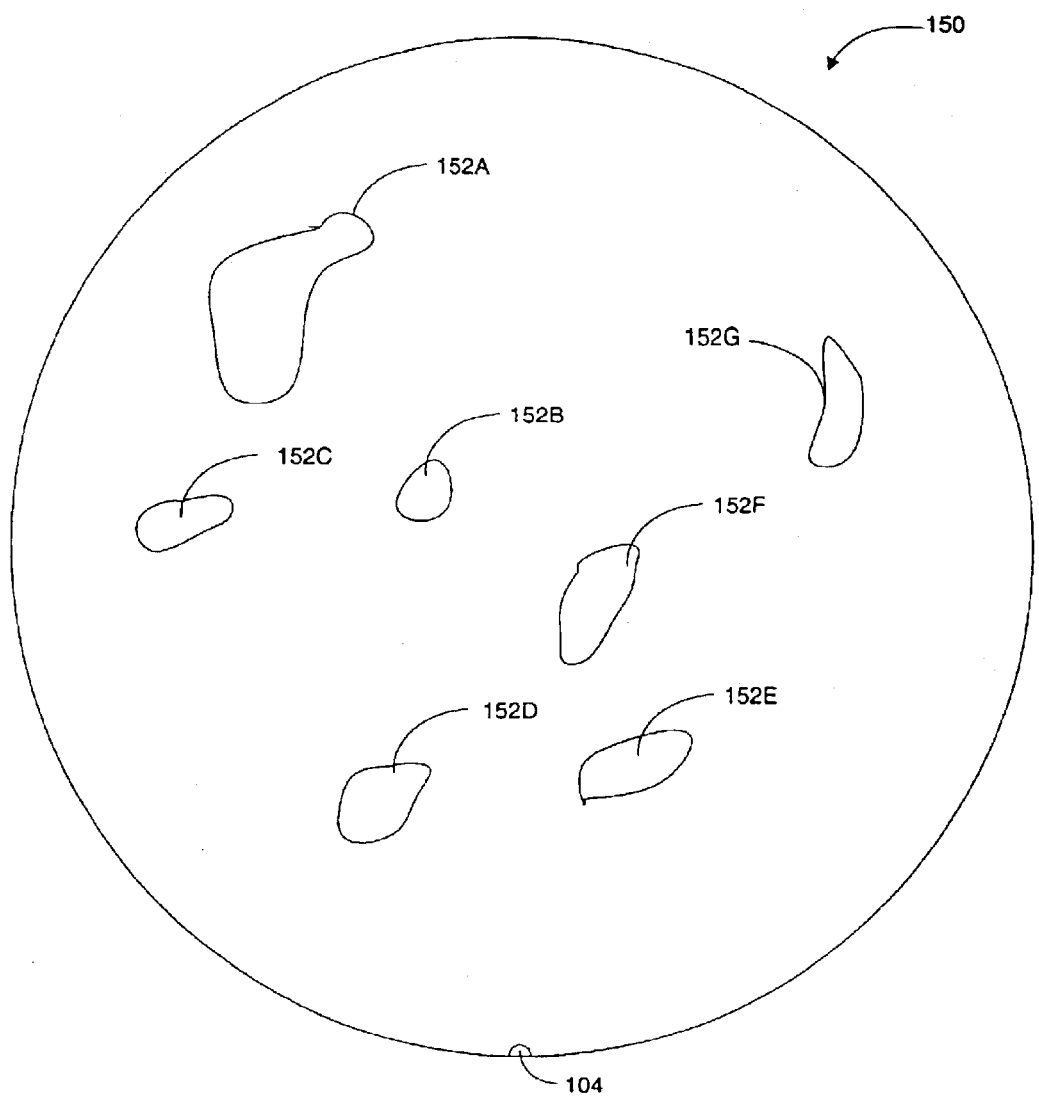
FIG. 1C shows a typical wafer with multiple, asymmetrical nonuniformities.
Figure 1D:
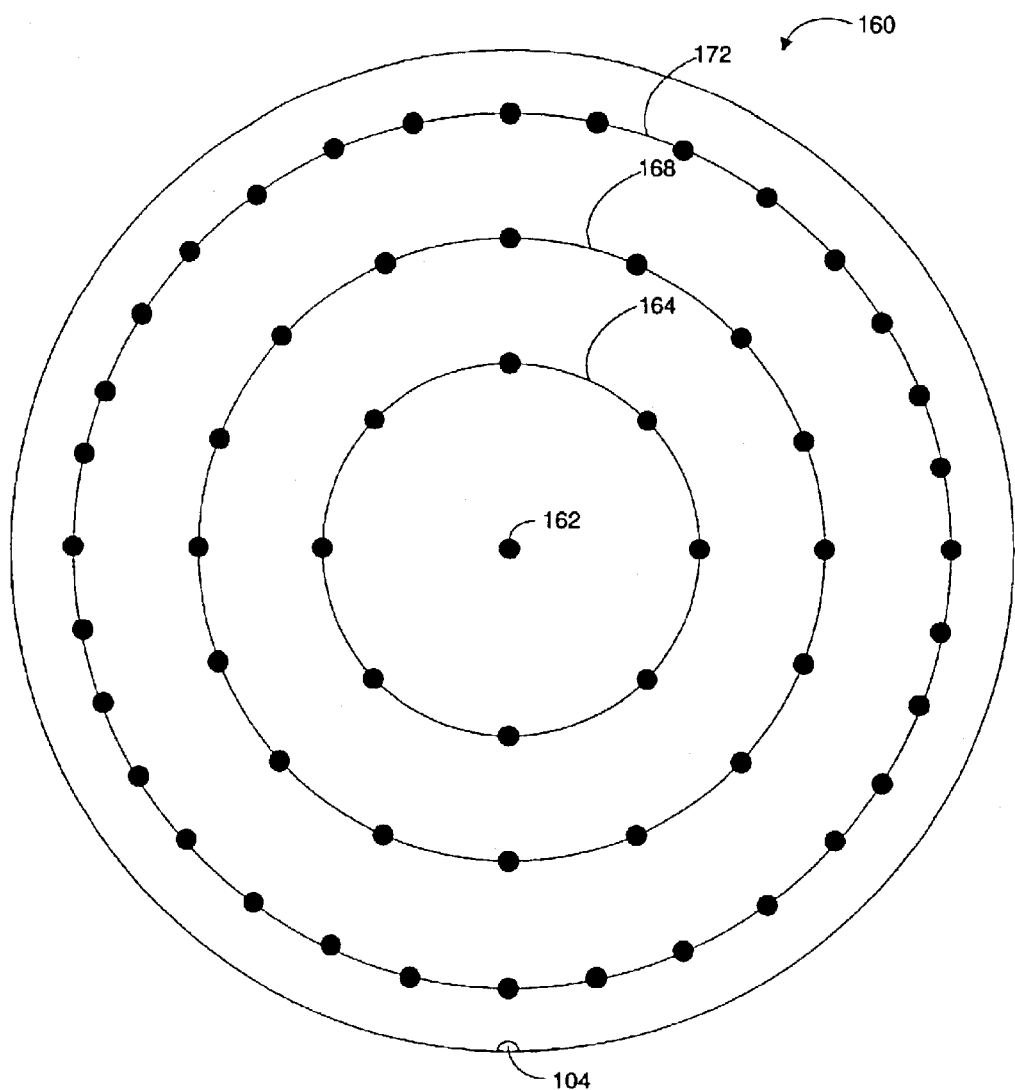
FIG. 1D shows a typical 49-point scan of wafer.

Several exemplary embodiments for objectively quantifying nonuniformities on a semiconductor wafer and also define a location and a shape of the nonuniformities will now be described. It will be apparent to those skilled in the art that the present invention may be practiced without some or all of the specific details set forth herein.

The control of the various semiconductor manufacturing processes are constantly being refined to provide ever more precise control so as to provide ever more predictable production performance and therefore semiconductor performance. As the semiconductor wafer manufacturing processes are refined the nonuniformities become ever smaller but still often occur. Typically, the nonuniformities can be identified as being a result of a change in a process variable in a preceding manufacturing process or a particular design feature of the manufacturing process and the manufacturing equipment. An accurate, objective description of the nonuniformity is required to provide an accurate comparison between wafers and also to provide a more accurate correlation between cause (e.g., process variability) and effect (e.g., nonuniformity). Therefore, the need to accurately define the location and shape of the wafer nonuniformities requires more precise measurements than a summary metric such as the 3-sigma metric and/or a subjective verbal description can provide.

One embodiment uses a mass analogy concept to objectively describe a location of the nonuniformity. The mass analogy concept analogizes the thickness of a nonuniformity to a quantity of mass of the nonuniformity and then determines a center of mass of the nonuniformity to determine a location of the nonuniformity relative to the center of the wafer. In this manner a precise location of the nonuniformity can be described. The location metric of the nonuniformity combined with the 3-sigma uniformity magnitude metric of the nonuniformity or a modified mass analogical 3-sigma uniformity magnitude metric can provide more accurate, objective, quantifiable metric data that more precisely describes the nonuniformity. The more precise description of the nonuniformity allows a more precise comparison between multiple processed wafers that have similar nonuniformities. This allows for a more automated cataloging and analysis of the nonuniformities. The more precise location metric also allows a more definitive correlation between causes and nonuniformity that can be more easily automated.

Another embodiment can determine multiple shape metrics that describes an approximate shape of the nonuniformity. An approximate shape of a nonuniformity can be determined by using a combination of the center of mass and calculated moments of the inertia of the nonuniformity. The shape metrics can then be used to further objectively describe the nonuniformity. The shape metrics can also be cataloged to provide additional accurately defined aspects of the nonuniformity that can be correlated to variations in the preceding processes. An additional moment of the mass distribution can also be determined and used to describe the nonuniformity.

Figure 2A:
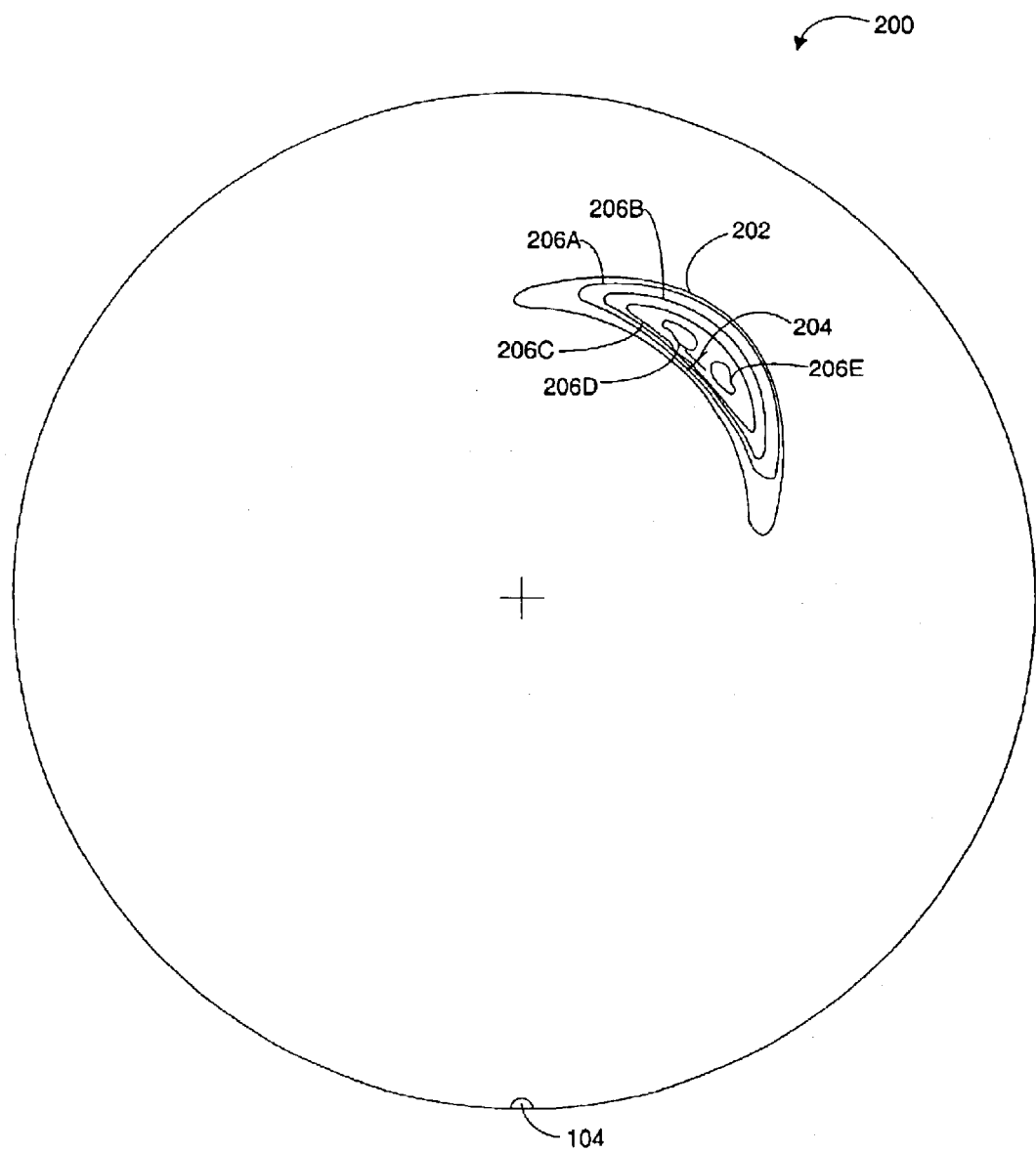
FIG. 2A shows a wafer with a detected nonuniformity, in accordance with one embodiment of the present invention.
Figure 3:
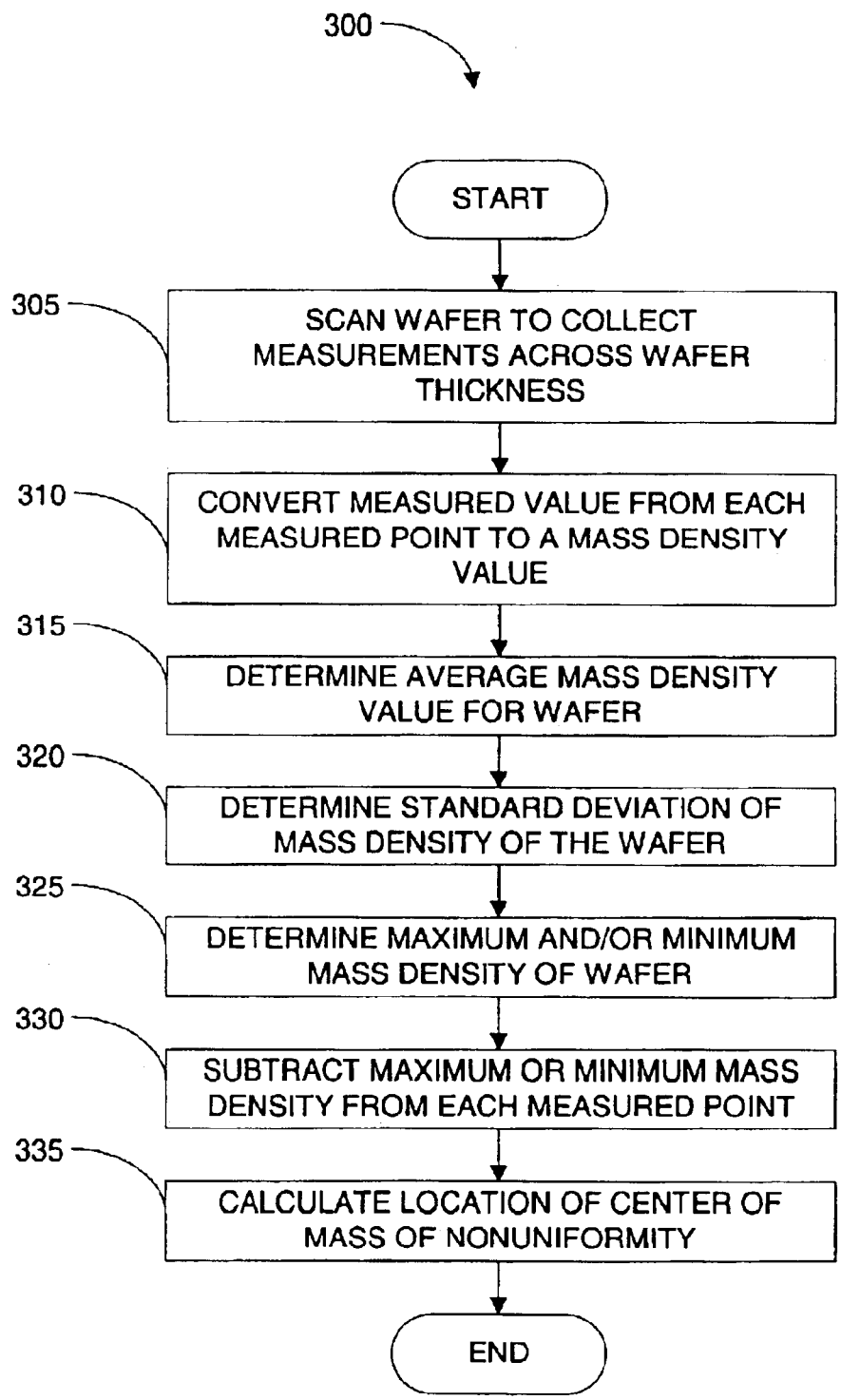
FIG. 3 is a flowchart of the method operations of determining a location of a nonuniformity in accordance with one embodiment of the present invention.

FIG. 2A shows a wafer 200 with a detected nonuniformity 202, in accordance with one embodiment of the present invention. FIG. 3 is a flowchart of the method operations 300 of determining a location of a nonuniformity 202 in accordance with one embodiment of the present invention. In operation 305, a scan is performed to collect measurements across the wafer. The nonuniformity 202 is detected and a measurement of the thickness of the nonuniformity is mapped. The measurement at each measured point in the scan is recorded (e.g., in a computer memory storage) by location and value. A point on the wafer that has a nonuniformity is thicker due to the presence of the nonuniformity.

In operation 310, the thickness value of each of the measured points is treated as an areal mass density value. By way of example, a measured thickness of 2.00 mm can be equated to a mass of 2.00 grams per square centimeter. For a given array of measurement points, there is an associated area of the wafer that each measurement point represents such that the sum of the areas represented by all of the measurement points is substantially equal to the entire measurement area of the wafer. This ensures that all of the measurement area of the wafer is represented. Typically the appropriate associated measurement points and subareas of the wafer are readily apparent, however, well known methods such as Voronoi tessellations can also be used. A mass of the wafer is calculated as a summation of the mass of the measured points multiplied by the associated area. The analogy to mass density is described in Formula 1 that follows. Formula 1 is for the idealized case where the mass density as a function of location, val( ), is perfectly known across the wafer where the radius has been normalized to one. The continuous integral equations are provided to show the analogy with the similar principals and equations in mechanics. The relevant pointwise summations are found by substituting the integrals over the wafer area for sums over the number of measurement sites and the rdrdθ are replaced by the area corresponding to the measured value. Using the mass analogy, Formula 1 is essentially the zero order spatial moment of the measured quantities.

$$\text{Mass} := \int_0^{2\pi} \int_0^1 \text{val}(r \cdot \cos(\theta), r \cdot \sin(\theta)) \cdot r \, dr \, d\theta$$

As described above, each measured point can be said to represent a given area of the wafer 200. Therefore, each point can be identified as representing a mass density for that portion of the area of the wafer 200. For example, if the given point above represents an area of the wafer of 14 square centimeters and has a mass of 14 grams, the given point can therefore be represented as having a mass density of 1 gram per square centimeter. In operation 315, an average mass density (e.g., mass per unity area) of the wafer is calculated according to the Formula 2 that follows:

$$\text{aveM} := \frac{\text{Mass}}{\text{Area}} \quad \text{Formula 2}$$

In operation 320, a standard deviation (e.g., sigma) of the mass of the wafer can optionally be calculated according to Formula 3 that follows:

$$\sigma := \left[ \frac{\int_0^{2\pi} \int_0^1 (\text{val}(r \cdot \cos(\theta), r \cdot \sin(\theta)) - \text{aveM})^2 \cdot r \, dr \, d\theta}{\text{Area}} \right]^{\frac{1}{2}} \quad \text{Formula 3}$$

In operation 325, a minimum and/or a maximum mass density (e.g., thickness) of the wafer are also determined. The nonuniformity 202 has multiple thickness regions shown by the "elevation" lines 206A, 206B, 206C building to two highest (i.e., thickest) areas 206D, 206E.

In operation 330, a minimum measured mass density (e.g., thickness) value is subtracted from the measured mass density (e.g., thickness) of each of the measured points to produce a difference mass density value (Uval) for each measured point (x, y) on the wafer. Subtracting the minimum mass density value from each of the measured points focuses the analysis of the nonuniformity 202 primarily on the nonuniformity and maintains positive definite quantities which assists in ensuring the mass analogy interpretations of the metrics are intact throughout the analysis. Alternatively, the maximum measured mass can also be subtracted and the difference mass value becomes a negative number and must be multiplied by negative one to further analyze the nonuniformity 202 (INUval). Corresponding nonuniformity mass ($U_{mass}$) can be calculated by substituting Uval for val in Formulas 1 and 2 above.

Figure 2B:
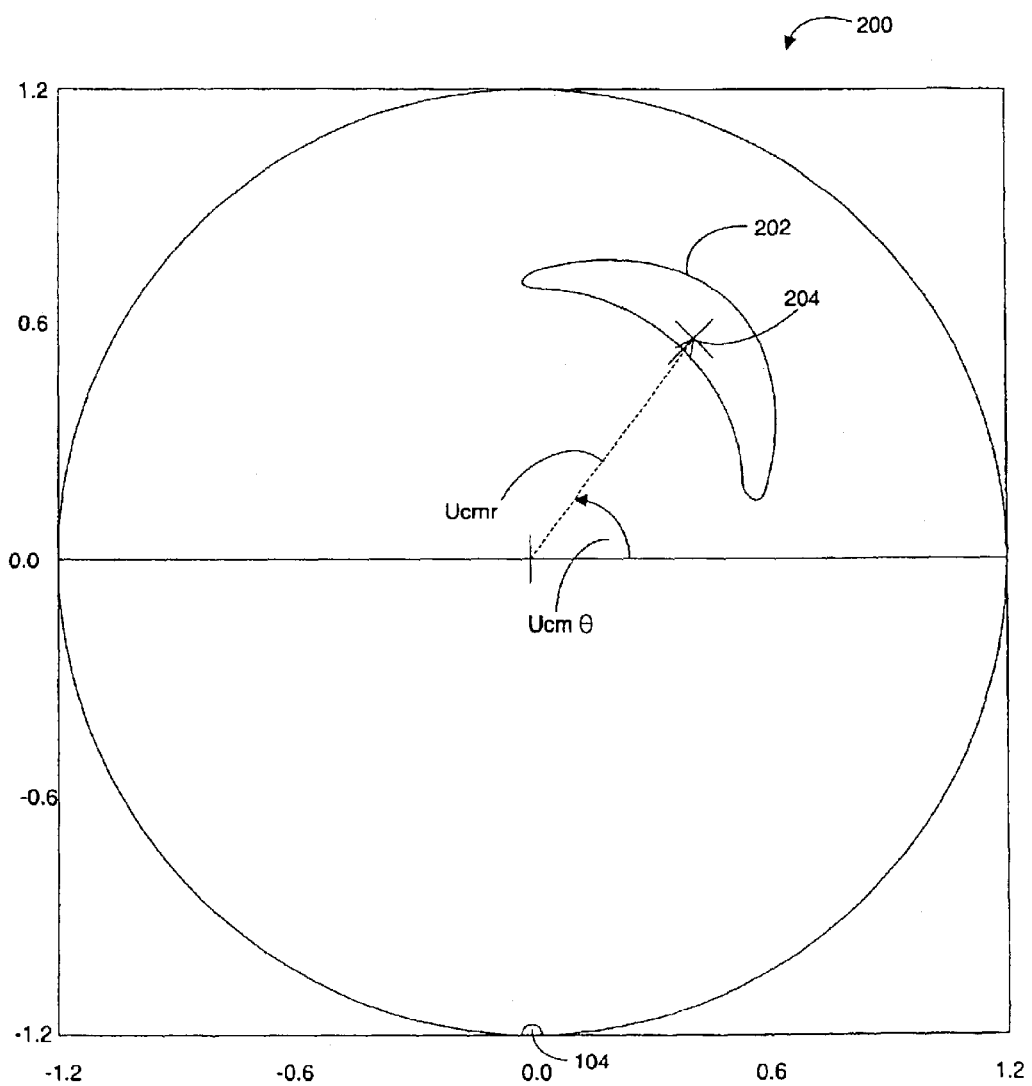
FIG. 2B shows the wafer with a detected nonuniformity, in accordance with one embodiment of the present invention.

FIG. 2B shows the wafer 200 with a detected nonuniformity 202, in accordance with one embodiment of the present invention. Referring to FIG. 2B and FIG. 3, in operation 335, the location of a center of mass 204 of the nonuniformity 202 is calculated. The coordinates of the center of mass 204 can be calculated by calculating each coordinate in the Cartesian coordinate system (X,Y), which are taken without loss of generality to be centered on the center of the wafer 200 with a normalized radius of one (1), according to the following Formulas 4 and 5 which are essentially the first order spatial moments of the measurement quantities:

$$\text{UX cm} := \frac{\int_0^{2\pi} \int_0^1 U \ \text{val}(r \cdot \cos(\theta), r \cdot \sin(\theta)) \cdot r \cdot \cos(\theta) \cdot r \, dr \, d\theta}{U \text{ Mass}} \quad \text{Formula 4}$$

$$\text{UY cm} := \frac{\int_0^{2\pi} \int_0^1 U \ \text{val}(r \cdot \cos(\theta), r \cdot \sin(\theta)) \cdot r \cdot \sin(\theta) \cdot r \, dr \, d\theta}{U \text{ Mass}} \quad \text{Formula 5}$$

Using well-known relationships, the Cartesian coordinates can be converted to provide a more easily usable polar coordinates (e.g., radius and angle location) of Ucmr and Ucmθ as the center of mass metrics of the nonuniformity 202. The precise location and orientation of the center of mass 204 of the nonuniformity 202 can be used as a more definite and objective numerical metrics to replace the prior art subjective descriptive terms such as side-to-side variation with a magnitude Ucmr and with a vaguely descriptive upper right orientation.

Figure 4A:
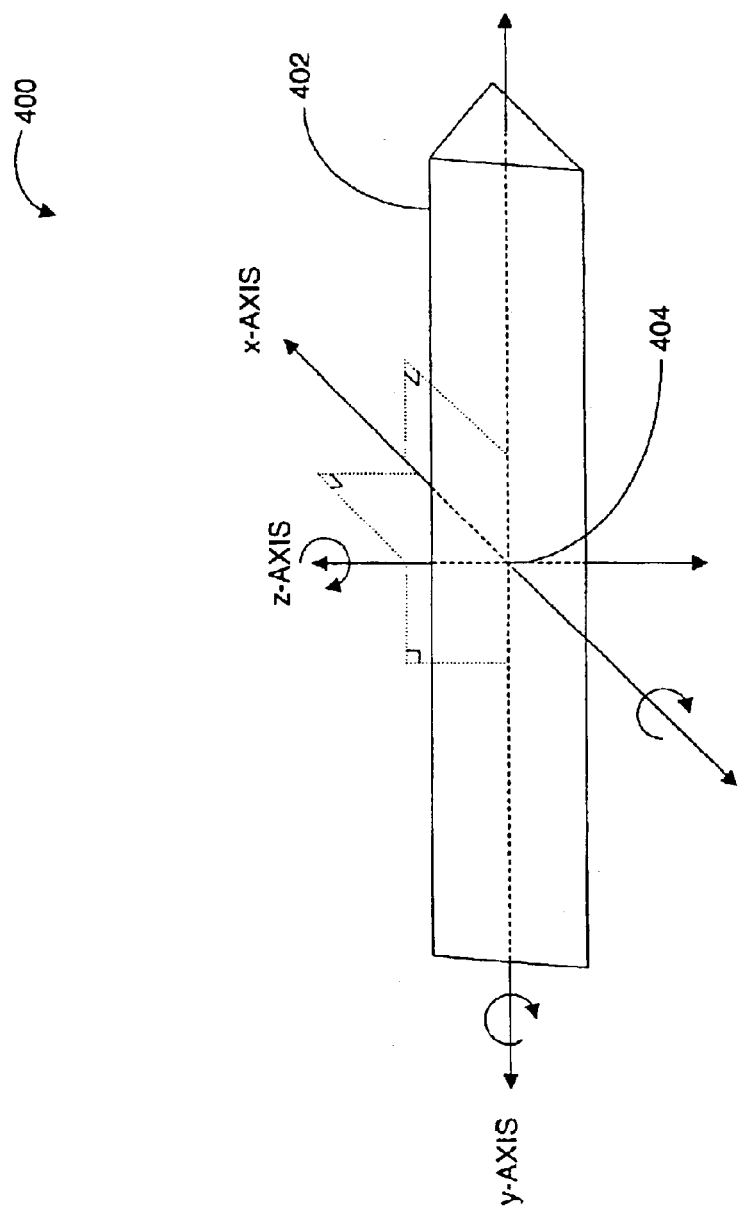
FIG. 4A shows a three-dimensional view of a nonuniformity in accordance to one embodiment of the present invention.

While specific location metrics (i.e. Ucmr, Ucmθ) provide additional, objective description of the nonuniformity 202, additional metrics that define a shape and an orientation of the nonuniformity can even further objectively describe the nonuniformity. FIG. 4A shows a three-dimensional view of a nonuniformity 400 in accordance to one embodiment of the present invention. The nonuniformity 400 has a length L, a height H, and a width W. The length L and width W correlate to the length and width of a nonuniformity in the plane of the surface of a wafer. The height H corresponds to the mass analogical thickness of the nonuniformity. As shown, the height H is shown out of proportion to the length L and width W so as to better illustrate the three dimensional characteristics of the nonuniformity 400.

Three axes (x-axis, y-axis, z-axis) pass through the nonuniformity at the center of mass 404 of the nonuniformity 400. Each of the three axes x, y and z are perpendicular (i.e., normal) to one another. The nonuniformity 400 can be rotated around each of the axes x, y, and z respectively.

Figure 4B:
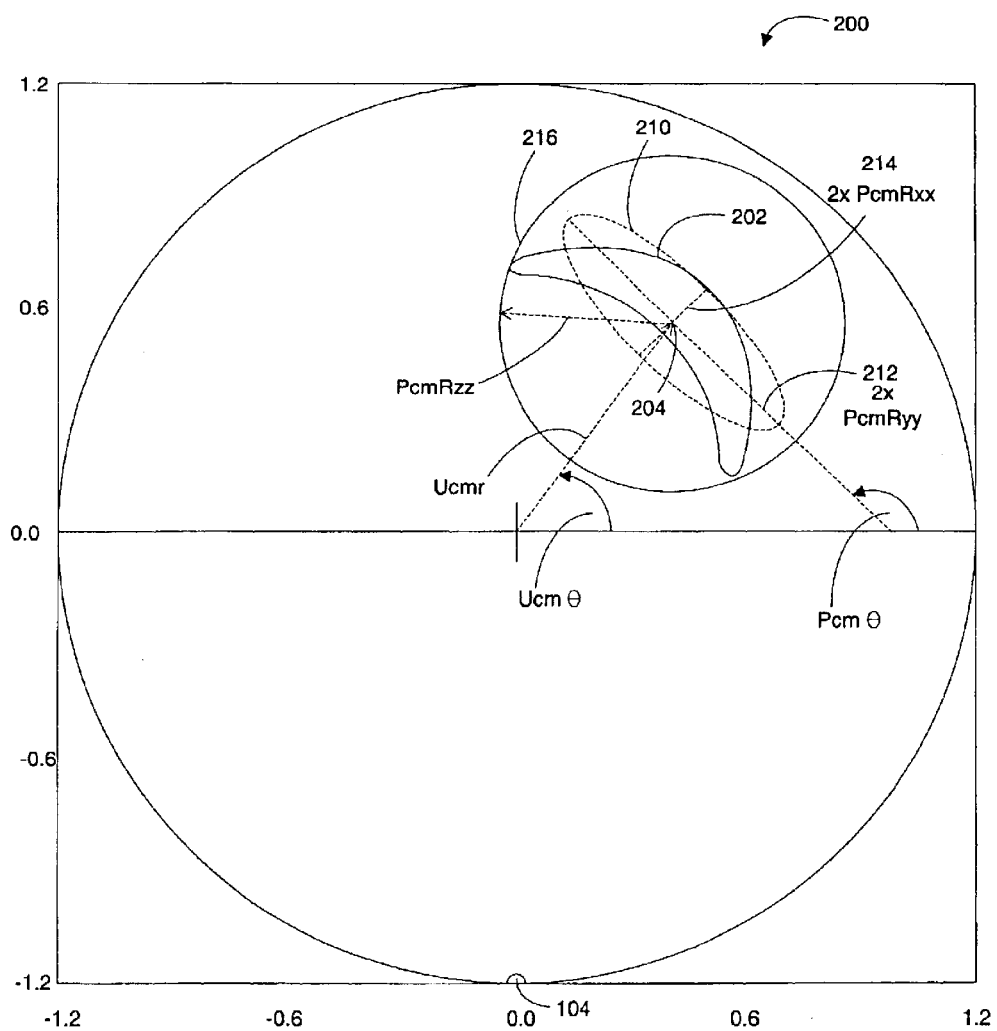
FIG. 4B shows the wafer and the nonuniformity in accordance with one embodiment of the present invention.

FIG. 4B shows the wafer 200 and the nonuniformity 202 in accordance with one embodiment of the present invention. Similar to the nonuniformity 400, described in FIG. 4A above, nonuniformity 202 also has a length, width and height and a center of mass 204 as described above in FIG. 2B. Three axes x, y and z pass through the center of mass 204 of the nonuniformity 202. The x-axis of the nonuniformity 202 is in line with the major axis 212 of an inertia ellipsoid 210 with respect to the center of mass origin. The y-axis of the nonuniformity 202 is in line with the minor axis 214 of the inertia ellipsoid 210 with respect to the center of mass origin. The z-axis of the nonuniformity 202 is not shown as it is perpendicular to the plane of the wafer 200 and passes through the center of mass 204 of the nonuniformity 202. The z-axis is in line with the remaining principal axis of the inertia ellipsoid with respect to the center of mass origin. Due to the symmetry of construction of these metrics, one principal axis of the inertia ellipsoid 210 with respect to the center of mass is perpendicular to the plane of the wafer 200.

Figure 5:
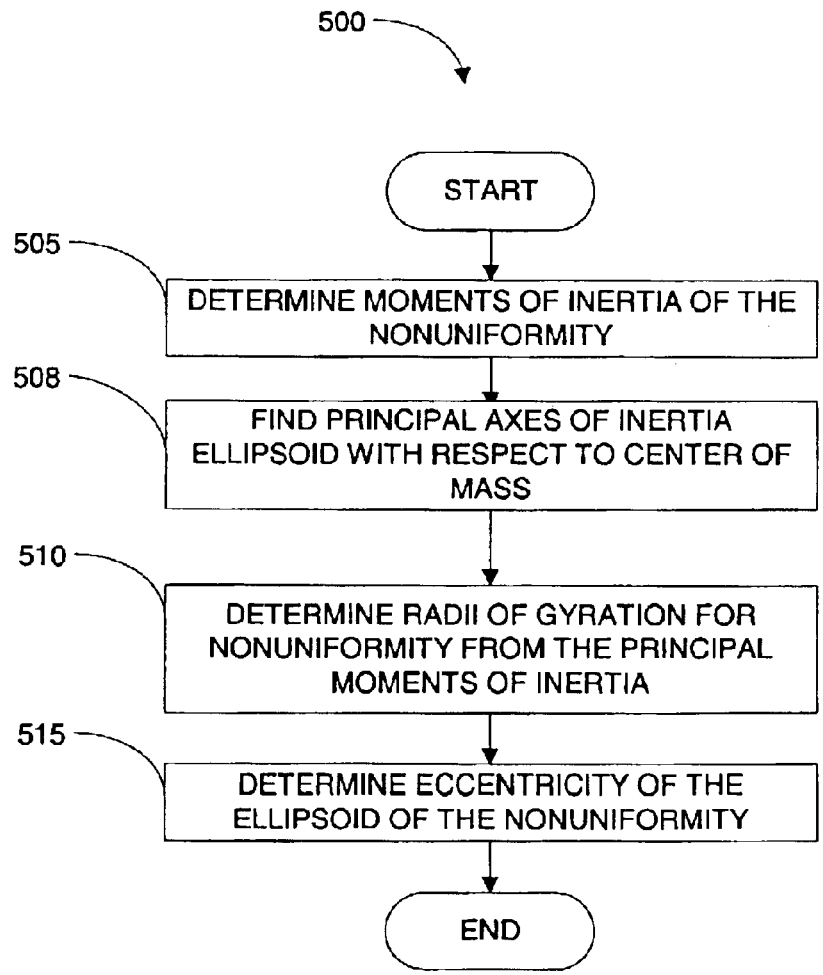
FIG. 5 is a flowchart of the method operations for determining a shape and orientation of the nonuniformity 202 in accordance with one embodiment of the present invention.

FIG. 5 is a flowchart of the method operations for determining a shape and orientation of the nonuniformity 202 in accordance with one embodiment of the present invention. Referring to FIGS. 4 and 5, in operation 505, three moments of inertia cmIxx, cmIyy and cmIzz, of the mass distribution of the nonuniformity 202 are determined. Each of the moments of inertia are calculated as the nonuniformity is rotated around each of the axes x, y and z such as shown in FIG. 4A above. An xy product of intertia must also be calculated by the following Formulas 6, 7, 8 and 9, respectively:

$$\text{cmIxx} := \int_0^{2\pi} \int_0^1 U \ \text{val}(r \cdot \cos(\theta), r \cdot \sin(\theta)) \cdot (r \cdot \sin(\theta) - \text{UY cm})^2 \cdot r \, dr \, d\theta \quad \text{Formula 6}$$

$$\text{cmIyy} := \int_0^{2\pi} \int_0^1 U \ \text{val}(r \cdot \cos(\theta), r \cdot \sin(\theta)) \cdot (r \cdot \cos(\theta) - \text{UX cm})^2 \cdot r \, dr \, d\theta \quad \text{Formula 7}$$

$$\text{cmIzz} := \int_0^{2\pi} \int_0^1 U \ \text{val}(r \cdot \cos(\theta), r \cdot \sin(\theta)) \cdot [(r \cdot \sin(\theta) - \text{UX cm})^2 + (r \cdot \sin(\theta) - \text{UY cm})^2] \cdot r \, dr \, d\theta \quad \text{Formula 8}$$

-continued $$cmIxy := \int_0^{2\pi} \int_0^1 U\ val(r \cdot \cos(\theta), r \cdot \sin(\theta)) \cdot (r \cdot \cos(\theta) - UX\ cm) \cdot (r \cdot \sin(\theta) - UY\ cm) \cdot r dr d\theta \qquad \text{Formula 9}$$

If all the mass of the nonuniformity 202 were concentrated at the center of mass 204 of the nonuniformity 202, then the moments of inertia would be very small. However, in nonuniformity 202, the mass distribution of the nonuniformity is significantly distributed away from the center of mass 204. Therefore, the four moments of inertia cmIxx, cmIyy, cmIxy and cmIzz can be significant These are essentially the second order spatial moments of the measured quantities. The xz, zx, zy and yz moments are zero by symmetry and the definition of the center of mass 204. The xz, zx, yz, zy moments and cmIxx, cmIyy, cmIzz, cmIxy (cmIxy=cmIyx in accordance with the mass analogy) are the elements of the inertia matrix, cmI, centered at the center of mass 204, in parallel with the analogy to classical mechanics. These moments can be calculated with any orientation of x and y axes. For simplicity, the symmetry is assumed so that the z axis can be chosen as being out of the plane of the wafer 200.

The principle axes of the inertia ellipsoid 210 with respect to the center of mass 204 is not yet known, therefore the inertia matrix cmI must be diagonalized which can be physically interpreted as rotating the x and y axes in operation 508. A rotation angle Pcmθ and corresponding rotation matrix must be determined for the inertia matrix cmI such as the following Formula 11:

$$R := \begin{bmatrix} \cos(Pcm\ \theta) & \sin(Pcm\ \theta) & 0 \\ -\sin(Pcm\ \theta) & \cos(Pcm\ \theta) & 0 \\ 0 & 0 & 1 \end{bmatrix} \qquad \text{Formula 11}$$

Such that the inertia matrix in the rotated reference frame shown in the following Formula 12 is diagonal:

$$PcmI := R \cdot cmI \cdot R^T \qquad \text{Formula 12}$$

Only the diagonal elements of the inertia matrix, three moments of inertia PcmIxx, PcmIyy and PcmIzz, are non-zero when the axes are the principle axes of the inertia ellipsoid 210. Each of the three radii of gyration PmcRzz, PmcRyy, PmcRxx about the principle axes of the inertia ellipsoid 210 with respect to the origin at the non-uniformity center of mass 204 are determined respectively from the three moments of inertia PcmIxx, PcmIyy and PcmIzz, in operation 510, such as shown in the following Formula 13 for PmcRxx:

$$PcmRxx := \sqrt{\frac{PcmI_{xx}}{U\ Mass}} \qquad \text{Formula 13}$$

The three radii of gyration PcmRzz, PcmRyy and PcmRxx are formed about the principal axes of the inertia ellipsoid x, y, and z with respect to origin at the center of mass 204 of the nonuniformity 202. The three radii of gyration PcmRzz, PcmRyy and PcmRxx normalize out the mass from the nonuniformity 202 so that all that remains is a vector of values quantifying the shape of the nonuniformity 202. PcmRzz is equal to a radius of a circle 216 that encircles the nonuniformity 202 and has a center at the center of mass 204. PcmRyy, PcmRxx are the radii of gyration about the principal axes of the inertia ellipsoid 210 in the plane of wafer 200. Radii of gyration PcmRyy, PcmRxx are equal to one half the length of the respective major and minor axes of the ellipsoid 210.

Radii of gyration PcmRyy, PcmRxx define an ellipse 210 and also that provides some idea how circular shaped or elongated the nonuniformity 202 is in the plane of the wafer 200. The eccentricity of an ellipse can be within a range of a 0 for a circle to 1 for a bar shape. When normalized to the wafer radius the three gyration radii PcmRxx, PcmRyy, PcmRzz define how much the ellipsoid 210 resembles a point (e.g., 0, 0, 0), a bar (e.g., $12^{-1\ 1/2}$, 0, $12^{-1/2}$), a disk (e.g., $2^{-1}$, $2^{-1}$, $2^{-1/2}$) or a ring (e.g., $2^{-1/2}$, $2^{-1/2}$, 1). Disk to ring ratios between in plane and normal values are the same, but PcmRzz changes magnitude. In operation 515, an eccentricity of the ellipsoid 210 is calculated by the following Formula 14:

$$\text{Eccentricity} := \frac{\sqrt{\max((PcmRxx\ PcmRyy))^2 - \min((PcmRxx\ PcmRyy))^2}}{\max((PcmRxx\ PcmRyy))} \qquad \text{Formula 14}$$

In operation 508, an orientation metric Pcmθ is determined. Pcmθ is the angle between principle axis 212, of the ellipsoid 210 and the X-axis through the center of the wafer 200. Orientation metric Pcmθ defines the orientation of the ellipsoid 210 with respect to the center of the wafer 200.

Referring again to FIG. 4B, the nonuniformity 202 can be objectively described by the following metrics: Ucmr= 0.348, Ucmθ=45 degrees, PcmRzz=0.40, PcmRxx=0.21, PcmRyy=0.34, eccentricity=0.79 and PCMθ=135 degrees. The relationships between the uniformity focused mass densities determined by utilizing subtraction of the minimum mass density (Uval), as above, can be related to those by subtraction of the maximum mass density and multiplying by negative one. (INUval) can be determined by substitution in Formulas 1–14. Other subtractive or additive constants may also be used although the minimum and maximum are preferable for focusing the analysis on characterization of the nonuniformities. Using these methods provides alternative quantities that can be used to characterize the nonuniformity. Exploiting the mass analogy, it can be appreciated that adding or subtracting these constants is equivalent to increasing the mass density uniformly across the wafer. It can be readily shown that the uniformity metrics approach those of a uniform massive disk as the relative size of the additive constants becomes larger compared to the nonuniform components. The subtle differences between analyses based on Uval and INUval can at times provide a convenient, simple numerical distinction between certain degenerate nonuniformity patterns with the same mass density and the same center of mass, but different radial mass distributions. Also for example, in FIG. 4B, if the nonuniformity displayed reflected a reduction in mass density, the relevant Uval density would be dominated by the more uniform massive disk values across the rest of the wafer outside nonuniformity 202 and hence the Uval based metrics would be much closer to the metrics of a uniform massive disk. Hence it might be preferrable to calculate metrics based on INUval in order to recover circle 216 that encircles the nonuniformity 202 and has a center at the center of mass 204 which will be more sensitive to changes in the local nonunformity.

Figure 6:
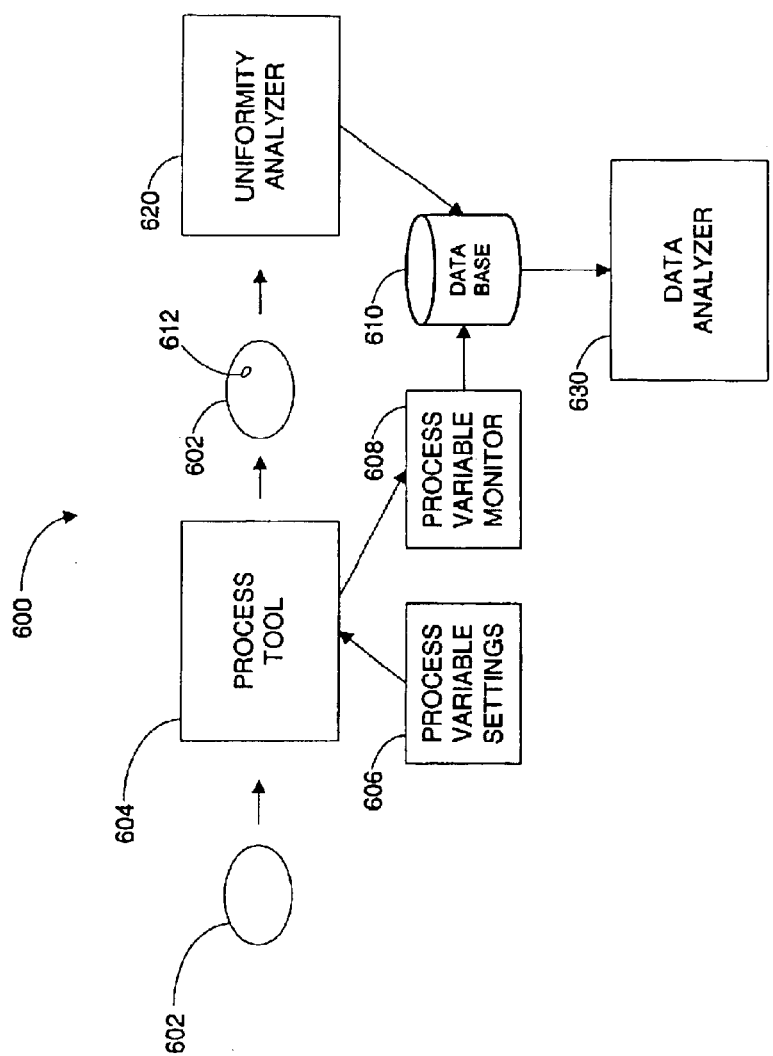
FIG. 6 is a block diagram of a system for determining causal relationships between manufacturing process variables and a nonuniformity, in accordance with one embodiment of the present invention.
Figure 7:
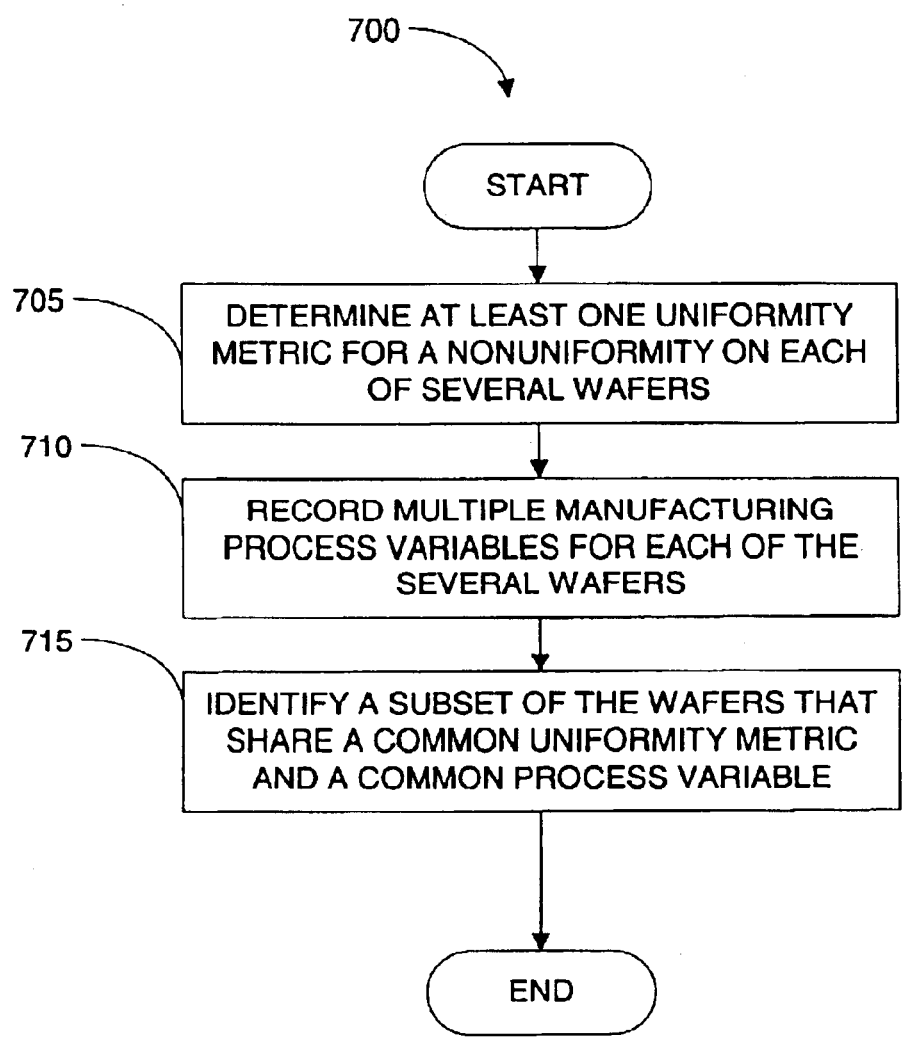
FIG. 7 is a flowchart of the method operations for determining causal relationships between manufacturing process variables and a nonuniformity, in accordance with one embodiment of the present invention

As described above, more defined, objective uniformity metrics will aid in determining causal relationships between manufacturing process variables and the resulting nonuniformity. FIG. 6 is a block diagram of a system 600 for determining causal relationships between manufacturing process variables and a nonuniformity, in accordance with one embodiment of the present invention. FIG. 7 is a flowchart of the method operations 700 for determining causal relationships between manufacturing process variables and a nonuniformity, in accordance with one embodiment of the present invention. A wafer 602 is input to a process tool 604 where a manufacturing process, such as etching, is applied to the wafer 602.

The manufacturing process includes multiple process variables (e.g., pressures, flow rates, solutions, timing, sequencing, power and other process variables) that are applied to the wafer 602 during the manufacturing process. The manufacturing process variables are input by a controller 606 or other manner of inputting the process variables to the process tool 604.

A monitor 608 monitors the manufacturing process variables in the process tool. The monitor 608 can actually monitor the process variables occurring in the process tool 604 or alternatively, can accept the process variable set points that are output from the controller 606 or a combination thereof. The monitor 608 outputs the monitored process variable data to a database 610.

When the manufacturing process(es) within the process tool 604 are complete, the wafer 602 is output. The wafer 602 may have a nonuniformity 612 so the wafer is analyzed in a uniformity analyzer 620. The uniformity analyzer can perform the operations described above in FIGS. 2A–5 to characterize the wafer and determine objective metrics that describe the nonuniformity 612. The uniformity analyzer 620 outputs the characterization data of the wafer and the objective metrics that describe the nonuniformity 612 to the database 610 or an alternative database (not shown).

A data analyzer 630 can be a computer either general purpose or could be purpose built to analyze the process variable data and the characterization data of the wafer and the objective metrics that describe the nonuniformity for multiple wafers. The data analyzer 630 includes logic that attempts to correlate (e.g., causal connections) common occurrences of nonuniformities and variations in one or more process variables.

Since the nonuniformities have more definitive and objectively descriptive metrics (e.g., Ucmr, Ucmθ, PcmRzz, PcmRxx, PcmRyy, eccentricity, and Pcmθ) then very specific causal correlations are possible that were not possible with the much more subjective, prior art type descriptions of the nonuniformities. Further the more definitive and objectively descriptive metrics also allow a more accurate computerized analysis of the process variable data and the characterization data of the wafer and the objective metrics that describe the nonuniformity that were not easily computerized using the much more subjective, prior art type descriptions of the nonuniformities.

As used herein in connection with the description of the invention, the term "about" means +/–10%. By way of example, the phrase "about 250" indicates a range of between 225 and 275. With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in FIGS. 3 and 5 are not required to be performed in the order illustrated, and that all the processing represented by the operations may not be necessary to practice the invention. Further, the processes described in FIGS. 3 and 5 can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of determining a plurality of uniformity metrics of a semiconductor wafer comprising:
   quantitatively defining a location metric of a nonuniformity on the surface of the wafer includes:
      measuring a quantity at a plurality of locations on a top surface of the wafer, and
      determining a center of mass analogy of the nonuniformity, wherein the center of mass analogy includes equating each one of the measured quantity at the plurality of locations to a mass value.

2. The method of claim 1, wherein measuring the quantity at the plurality of locations on the top surface of the wafer includes measuring a thickness at a plurality of locations on the wafer and converting the measured thickness at each one of the plurality of locations on the wafer to a corresponding mass analogy density value.

3. The method of claim 2, further comprising determining an average mass analogy density value for the wafer.

4. The method of claim 2, further comprising determining a standard deviation of the density mass analogy of the wafer.

5. The method of claim 2, wherein determining the center of mass analogy of the wafer includes subtracting a selected value from each of the plurality of corresponding mass analogy density values.

6. The method of claim 5, wherein the selected value is one of a group consisting of a minimum mass analogy density value of the wafer and a maximum mass analogy density value of the wafer.

7. The method of claim 6, further comprising calculating a side-to-side variation and direction of the nonuniformity.

8. The method of claim 7, further comprising:
determining a shape metric of the nonuniformity including:
determining at least one moment of inertia of the nonuniformity; and
determining a radius of gyration for each one of the at least one principal moment of inertia.

9. The method of claim 8, wherein each of the at least one principal moment of inertia is determined around an axis that passes through the center of mass analogy of the nonuniformity.

10. The method of claim 8, wherein the at least one principal moment of inertia includes at least three principal moments of inertia.

11. The method of claim 10, further comprising determining an ellipsoid that is defined by two of the at least one principal moment of inertia.

12. The method of claim 11, further comprising determining an eccentricity of the ellipsoid.

13. The method of claim 11, further comprising determining an orientation of the ellipsoid.

14. A method of determining a correlation between a process variable and a nonuniformity comprising:
characterizing a plurality of wafers including:
determining at least one uniformity metric of a nonuniformity on each one of the plurality of wafers, the at least one uniformity metric including at least one location metric of the nonuniformity on each one of the plurality of wafers; and
recording each one of a plurality of process variables for each one of the plurality of wafers; and
identifying a common uniformity metric in a subset of the plurality of characterized wafers that share a common process variable.

15. The method of claim 14, wherein characterizing the plurality of wafers also includes determining at least one shape metric of the nonuniformity for each one of the plurality of wafers.

16. A system for determining a correlation between a process variable and a nonuniformity on a semiconductor wafer comprising:
a scanning device that has the capability of measuring a quantity at a plurality of locations of each one of a plurality of wafers;
a database that includes a plurality of process variables and the plurality of measured quantities at corresponding plurality of locations for each one of the plurality of wafers, the database coupled to the scanning device;
a processor coupled to the database; and
a logic that identifies a common uniformity metric in a subset of the plurality of scanned wafers that share a common process variable, the common uniformity metric includes a location metric of a nonuniformity on the surface of the wafer, the location metric including a center of mass analogy of the nonuniformity.

17. The system of claim 16, wherein the common uniformity metric further includes at least one shape metric of the nonuniformity.

18. The system of claim 16, wherein the common uniformity metric further includes an ellipsoid that is defined by two principal moments of inertia of the nonuniformity.

19. The system of claim 18, wherein the common uniformity metric further includes an eccentricity of the ellipsoid.

20. The system of claim 18, wherein the common uniformity metric further includes an orientation of the ellipsoid.

* * * * *